United States Patent
Yorita et al.

(10) Patent No.: US 7,713,052 B2
(45) Date of Patent: May 11, 2010

(54) PROCESSING METHOD OF FINE STRUCTURE AND PROCESSING EQUIPMENT FOR FINE STRUCTURE

(75) Inventors: Jun Yorita, Hyogo (JP); Katsunari Mikage, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/885,079

(22) PCT Filed: Feb. 21, 2006

(86) PCT No.: PCT/JP2006/303016

§ 371 (c)(1),
(2), (4) Date: Nov. 19, 2007

(87) PCT Pub. No.: WO2006/090682

PCT Pub. Date: Aug. 31, 2006

(65) Prior Publication Data

US 2008/0169583 A1 Jul. 17, 2008

(30) Foreign Application Priority Data

Feb. 25, 2005 (JP) .............................. 2005-050829
Apr. 28, 2005 (JP) .............................. 2005-132561

(51) Int. Cl.
*B29C 51/42* (2006.01)
*B29C 59/00* (2006.01)

(52) U.S. Cl. .................. 425/384; 425/385; 264/293

(58) Field of Classification Search ................. 425/385, 425/384, 407; 264/293
See application file for complete search history.

(56) References Cited

U.S. PATENT DOCUMENTS

| | | | | |
|---|---|---|---|---|
| 2,532,501 A | * | 12/1950 | Johnson | 264/40.5 |
| 4,752,204 A | * | 6/1988 | Kataoka | 425/384 |
| 5,893,994 A | * | 4/1999 | Irwin et al. | 219/388 |
| 5,945,137 A | * | 8/1999 | Mizuno et al. | 425/302.1 |
| 6,099,771 A | * | 8/2000 | Hudkins et al. | 264/102 |

(Continued)

FOREIGN PATENT DOCUMENTS

JP 1-109400 7/1989

(Continued)

OTHER PUBLICATIONS

Translation of JP 2004-74775, Nagase Integrex, LTD, Mar. 11, 2003.*

*Primary Examiner*—Maria Veronica D Ewald
(74) *Attorney, Agent, or Firm*—McDermott Will & Emery LLP

(57) ABSTRACT

In a processing method of a fine structure according to the present invention, an opposed platen (211) is moved from a retreat position to a molding/processing position, so that a film (1) is pressed against a mold (5) and processed. Thereafter a second block (211*b*) is separated from a first block (211*a*). Thus, improvement of the cooling rate for the opposed platen (211) can be attained by reducing the total thermal capacity of the opposed platen (211) by reducing the volume of the opposed platen (211) in cooling and physically discharging heat stored in the opposed platen (211). Thus, cooling efficiency for the opposed platen (211) is improved, and the heat cycle of the opposed platen (211) can be reduced.

18 Claims, 13 Drawing Sheets

U.S. PATENT DOCUMENTS

2003/0159608 A1 * 8/2003 Heidari .................. 101/494

FOREIGN PATENT DOCUMENTS

| JP | 02-102009 | 4/1990 |
| JP | 9-323200 | 12/1997 |
| JP | 2004-074775 | 3/2004 |
| JP | 2004-136333 | 5/2004 |
| JP | 2004-148398 | 5/2004 |
| JP | 2004-288784 | 10/2004 |

* cited by examiner

PROCESSING METHOD OF FINE STRUCTURE AND PROCESSING EQUIPMENT FOR FINE STRUCTURE

RELATED APPLICATIONS

This application is the U.S. National Phase under 35 U.S.C. §371 of International Application No. PCT/JP2006/303016, filed on Feb. 21, 2006, which in turn claims the benefit of Japanese Application No. 2005-050829, filed on Feb. 25, 2005 and Japanese Application No. 2005-132561, filed on Apr. 28, 2005, the disclosures of which Applications are incorporated by reference herein.

TECHNICAL FIELD

The present invention relates to a processing method of a fine structure employed for pattern formation of various devices integrated in the electronics field or the bio field and an processing equipment for the fine structure.

BACKGROUND ART

A semiconductor integrated circuit, various recording mediums, a biochip and the like are stationarily in the process of refinement and integration, and mask patterns or the like employed for manufacturing the same are also increasingly refined and integrated. After electron pattern exposure means has partially substituted for optical means, this tendency has been further strengthened, and the importance of a processing method of a fine structure is continuously increased. Following the aforementioned upsurge in refinement and integration, the number of steps, the time and materials required for processing the aforementioned fine structure are also increased, to result in remarkable increase of the cost.

In order to process the aforementioned fine structure, a step of transferring a fine pattern by stamping a stamper (mold) formed with the fine pattern on resin (molded material) of a temperature rise state with a prescribed molding pressure and thereafter unmolding the fine structure after the resin is cooled is inevitable. It is extremely effective to reduce a cycle of heating and cooling the aforementioned resin for reducing the cost for processing the aforementioned fine structure. Therefore, a printing equipment attaining an adiabatic structure by reducing the sectional area of a holding part holding a pressurizing surface of the stamper below the sectional area of the pressurizing surface of the aforementioned stamper in order to reduce the heating and cooling cycle is proposed (Japanese Patent Laying-Open No. 2004-288784 (Patent Literature 1)). According to the aforementioned printing equipment, the thermal capacity of the holding part is reduced as compared with that of a printer precedent thereto, whereby the heating and cooling cycle can be reduced.

Patent Literature: Japanese Patent Laying-Open 2004-288784

DISCLOSURE OF THE INVENTION

Problem to be Solved by the Invention

In the aforementioned printing equipment, the holding part of the pressurizing surface is heated and cooled along with the pressurizing surface. A molding pressure (pressurization) is so high in hot embossing or nanoimprinting that the aforementioned holding part must have rigidity exceeding a prescribed level in order to uniformize the in-plane molding pressure, thereby requiring prescribed mass and volume with thermal capacity of at least a prescribed value. Consequently, the time required for a heat cycle of the aforementioned holding part having larger thermal capacity than the molded material prevails in the aforementioned heat cycle, and reduction of the aforementioned cycle, i.e., improvement of the throughput is limited.

An object of the present invention is to provide a processing method of a fine structure capable of reducing the aforementioned heat cycle of heating and cooling and a processing equipment of a fine structure employed therefor.

Means for Solving the Problems

The processing method of a fine structure according to the present invention comprises at least two opposed platens opposed to a mold for processing a molded material into a fine structure, and uses at least two opposed platens while processing a single fine structure.

According to this method, the throughput can be improved by reducing a heat cycle of heating and cooling.

The processing equipment of a fine structure according to the present invention comprises a mold for processing a molded material into a fine structure, at least two opposed platens opposed to the mold and a drive unit for using at least two opposed platens while a single fine structure is processed.

According to another aspect, the processing equipment of a fine structure based on the present invention is a processing equipment of a fine structure, for processing a fine structure by holding a molded material between a mold and the front surface of an opposed platen and pressurizing/molding this molded material, and the aforementioned opposed platen has a first block, including a heating unit, positioned on the front surface and a second block positioned on the back surface for changing the thermal capacity of the aforementioned opposed platen. The first block and the second block are provided to be relatively movable between positions where the first block and the second block come into contact with each other and other positions where the first block and the second block separate from each other.

According to another aspect, the processing method of a fine structure based on the present invention is a processing method of a fine structure, for processing a fine structure by holding a molded material between a mold and the front surface of an opposed platen and pressurizing/heating/molding this molded material, performing pressurization/heating/molding of the aforementioned molded material while rendering the volume of the aforementioned opposed platen in heating and the volume of the aforementioned opposed platen in cooling different from each other.

According to still another aspect, the processing method of a fine structure based on the present invention is a processing method of a fine structure, for processing a fine structure by holding a molded material between a mold and the front surface of an opposed platen and pressurizing/heating/molding this molded material, bringing an external member into contact with the opposed platen after separating part of the aforementioned opposed platen in heating of the aforementioned molded material when cooling the aforementioned molded material.

Further, the method of or the processing equipment of a fine structure based on the present invention includes a case of heating and cooling the mold or a case of heating and cooling both of the mold and the molded material when finely processing the molded material.

EFFECTS OF THE INVENTION

According to the aforementioned method or the aforementioned equipment, a fine structure can be processed with an excellent throughput and an excellent yield. Further, the quality of the fine structure can be improved. The aforementioned drive unit may be in any form so far as the same is a drive unit rendering at least two opposed platens usable when a single fine structure is processed, and may be a unit moving the platens, a unit moving the mold, or a unit moving both of the platens and the mold.

When the molded material is cooled, the total thermal capacity of the opposed platens is reduced by reducing the volume of the opposed platens for physically discharging heat stored in the opposed platens, so that the cooling rate for the opposed platens can be improved.

The first block is heated when the opposed platens are heated while the second block which is the external member is brought into contact with the first block when the opposed platens are cooled thereby increasing the volume of the opposed platens in cooling and moving heat provided in the first block toward the second block, so that the cooling rate for the opposed platens can be improved.

Thus, heating efficiency for the opposed platens and cooling efficiency for the opposed platens are improved by pressurizing/heating/molding the molded material while rendering the volume of the opposed platens in heating and the volume of the opposed platens in cooling different from each other, so that the heat cycle of heating and cooling can be reduced. Consequently, the throughput required for processing the fine structure can be improved.

When the molded material is cooled, a third block which is the external member is brought into contact with the first block after the second block of the opposed platens formed by the first block and the second block in heating of the molded material is separated thereby reducing the total thermal capacity of the opposed platens by reducing the volume of the opposed platens immediately after the heating and physically discharging the heat stored in the opposed platens while bringing the third block which is the external member into contact with the first block in cooling for moving the heat provided in the first block to the third block in cooling, so that the cooling rate for the opposed platens can be improved.

DESCRIPTION OF THE REFERENCE NUMERALS

1 molded material (PC film), 1*a* fine structure (molded PC film), 5 mold, 5*a* mold section, 7 base material, 11, 12, 111, 112 platen, 17 base material support mechanism, 20 drive direction by drive unit, 25 direction of movement of base material support mechanism, 31, 32 temperature setter, 41 preheater, 211, 311 opposed platen, 211*a*, 305*a* first block, 211*b*, 305*b* second block, 211*c*, 305*c* third block, 211*h*, 305 heating/cooling block

BEST MODES FOR CARRYING OUT THE INVENTION

Embodiments of the present invention are now described with reference to the drawings.

First Embodiment

Figure 1:
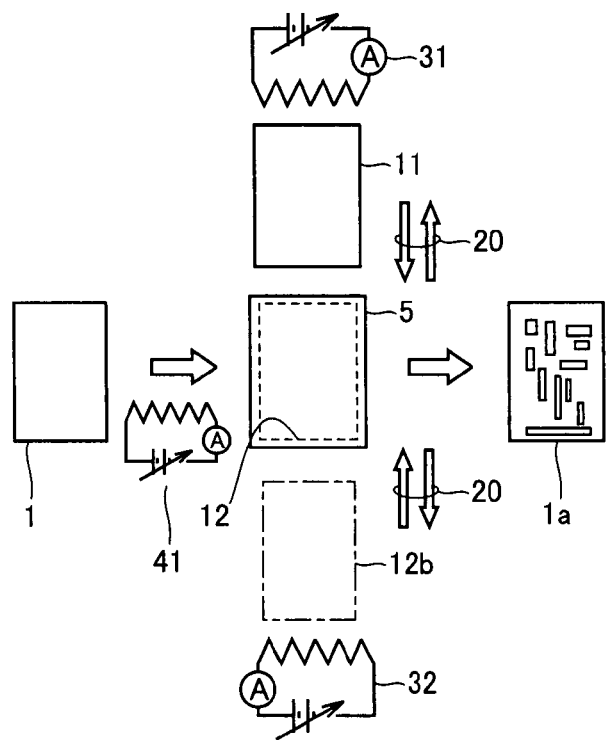
FIG. 1 is a diagram showing an outline of processing equipment of a fine structure according to a first embodiment of the present invention.

FIG. 1 is a top plan view showing an outline of a processing equipment of a fine structure according to a first embodiment of the present invention. Referring to FIG. 1, two movable opposed platens (hereinafter referred to as platens) 11 and 12 are arranged under a mold 5. In FIG. 1, cooling platen 12 is located on a molding/processing position immediately under mold 5, and heating platen 11 is located on a retreat position. Heating platen 11 is located on the molding/processing position when performing molding/processing by pressing the mold, and moves to the retreat position in cooling after the molding/processing. Cooling platen 12 is located on the molding/processing position when cooling molded/processed resin or the like before unmolding the same, and moves to a retreat position 12b when performing molding/processing by pressing mold 5 against a molded material 1 which is the resin. Referring to FIG. 1, reference numeral 20 denotes the direction of movement of platens 11 and 12 with a drive unit (illustration omitted) moving platens 11 and 12. The drive unit can be implemented with an arbitrary mechanism normally used for this type of drive unit.

Referring to FIG. 1, temperature setters 31 and 32 set platens 11 and 12 to prescribed temperatures respectively. These temperature setters 31 and 32 are formed by unillustrated temperature sensors, heaters, power sources etc. and hold the temperatures of the platens at constant levels. The temperature setters are not restricted to the aforementioned structure, but may be maintained at prescribed temperatures by introduction into a furnace held at a constant temperature.

Resin 1 which is the molded material is introduced into the molding/processing position where heating platen 11 is located from a direction not overlapping with a platen movement space for avoiding the movement space of platens 11 and 12, heated to a molding temperature, and thereafter processed through mold 5 pressed against the same. Thereafter platen 11 moves to the retreat position while maintaining the load in the aforementioned molding/processing, while platen 12 substitutionally moves to the molding/processing position for coming into contact with molded/processed resin 1a and cooling resin 1a. Thereafter processed resin 1a which is a fine structure is unmolded and carried onto an extension of the direction for introducing resin 1 before molding.

Resin 1 may be preheated by a preheater 41 before the same is placed on the molding/processing position. The preheater may be a furnace held at a constant temperature, or may be a heating apparatus such as a heater.

Platens 11 and 12, performing reciprocation which is linear movement in FIG. 1, are not restricted to this movement mode but any movement mode may be employed so far as the platens circularly move, such that at least two platens may circularly revolve, or may move while changing the vertical positions, for example. Also when an introduction line for molded material 1 and the platen movement space overlap with each other, no problem results from simple spatial overlapping unless the spatial loci of these overlap with each other at the same time.

While FIG. 1 shows the case of two platens 11 and 12, at least three platens may alternatively be arranged.

The basic elements in the aforementioned processing equipment of a fine structure are constituted of the mold for processing the molded material into the fine structure, at least two opposed platens opposed to the mold and the drive unit for using at least two opposed platens while a single fine structure is processed. The drive unit moving the platens can be constituted of an arbitrary known drive unit/mechanism, as described above. According to the aforementioned first embodiment, the unit moving the platens has been employed for using two platens while a single fine structure is processed. However, the unit may be an apparatus moving the mold while keeping the two platens stationary or an apparatus moving both of the platens and the mold, so far as two platens can be used while a single fine structure is processed. A drive unit moving the mold can also be constituted of an arbitrary known apparatus, similarly to the apparatus moving the platens.

The basic elements in the aforementioned method of processing a fine structure are constituted by comprising at least two opposed platens opposed to the mold for processing the molded material into the fine structure and using at least two opposed platens while a single fine structure is processed.

It is possible not to set the aforementioned at least two opposed platens to the same temperature. This method is so employed that the molded material (resin, resin provided with a substrate, various films, various composite materials or the like) can be efficiently heated and the molded fine structure can be efficiently and smoothly unmolded. Further, precise temperature control can be performed, for contributing to yield improvement and quality improvement of the fine structure.

The aforementioned platen drive unit can move at least two opposed platens between the retreat position where the opposed platens are not used and a use position where the opposed platens are used. According to this structure, at least two opposed platens can be efficiently differently used. For example, it is possible to employ an opposed platen having been held at a stamping temperature during molding/processing, and to employ another opposed platen having been held at an unmolding temperature when detaching the fine structure from the mold through a pressurization maintaining period.

The aforementioned molded material can be preheated before the same is heated between the mold and the opposed platens. According to this method, the resin has already been heated, whereby the heating time can be remarkably reduced and the throughput can be further improved.

The aforementioned molded material may be in any form, and may be resin, resin provided with a substrate, various films, various composite materials or the like. As to the resin or a resin film, thermoplastic resin such as polyethylene, polypropylene, polyvinyl alcohol, polyvinylidene chloride, polyethylene terephthalate, polyvinyl chloride, polystyrene, ABS resin, AS resin, acrylic resin, polyacetal, polybutylene terephthalate, glass-reinforced polyethylene terephthalate, polycarbonate, denatured polyphenylene ether, polyphenylene sulfide, poly(etheretherketone), liquid crystal polymer, fluororesin, polysulfone, poly(ethersulfone), polyamidimide, polyetherimide or thermoplastic polyimide, thermosetting resin such as phenolic resin, melamine resin, urea resin, epoxy resin, unsaturated polyester resin, alkyd resin, silicone resin, diallyl phthalate resin, polyamide bismaleimide resin, polybisamide triazole or the like, or a material prepared by blending at least two of these materials with each other may be employed.

Various steel materials can be employed for the mold and the platens. For example, steel plates or forgings of SS41 can be employed. Heat-resistant resin can also be employed for the mold, in place of the steel material. Any known machining such as lathing, milling, electric discharge machining, laser beam machining, electron beam processing or etch machining may be employed for machining the mold.

Second Embodiment

Figure 2:
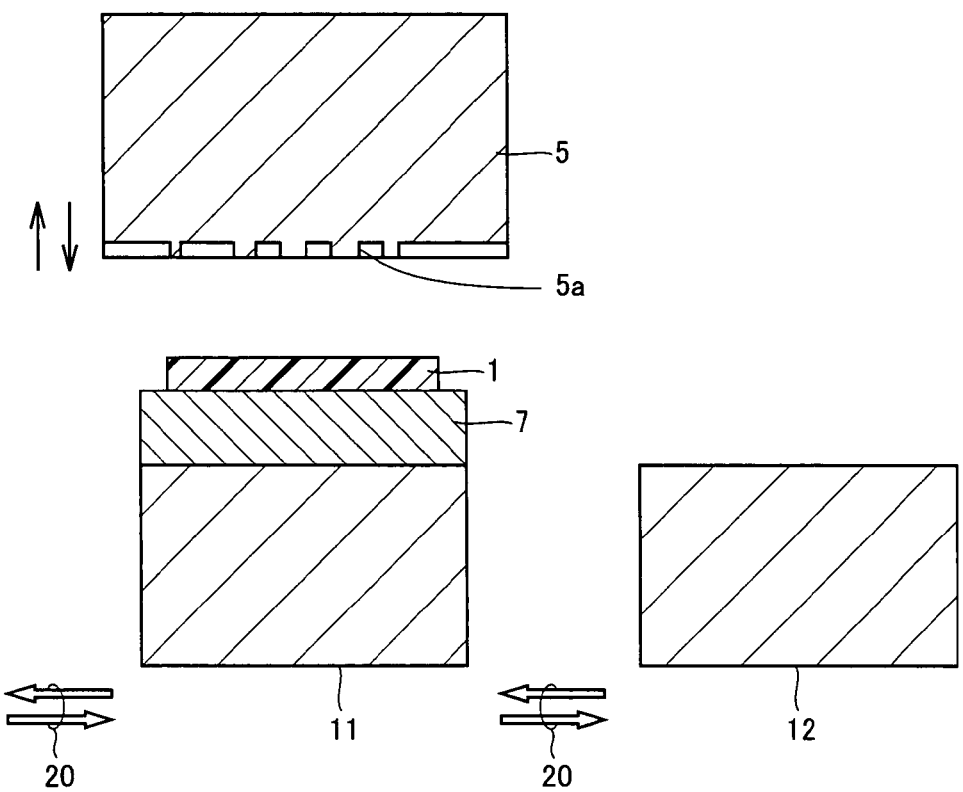
FIG. 2 is a sectional view showing processing equipment of a fine structure according to a second embodiment of the present invention.

FIG. 2 is a sectional view showing an outline of a processing equipment of a fine structure according to a second embodiment of the present invention. Referring to FIG. 2, a platen 11 for a high temperature is arranged immediately under a mold 5, i.e., on a molding/processing position, while a platen 12 for cooling retreats to a retreat position. The feature of this embodiment resides in such a point that a base material 7 is arranged on platen 11, and a film 1 which is a molded material is arranged on this base material 7. Referring to FIG. 2, a mold section 5a is pressed against film 1 supported by base material 7 when film 1 is molded/processed with mold section 5a of mold 5. In this molding/processing, film 7 is heated by platen 11 along with base material 7.

Base material 7 is supported by a base material support mechanism (not shown), in order to continuously maintain the state of pressing the film against mold 5 also when platen 11 moves to the retreat position after the molding/processing. Maintenance of this state is important in order to keep such a state that resin or the like constituting the film fluctuates to be sufficiently charged into a recess and corners of mold section 5a. After platen 11 moves, platen 12 for cooling moves to the molding/processing position in the state where base material 7 presses film 1 against mold 5, for supporting base material 7 from below and cooling film 1.

Needless to say, movement in a direction intersecting with a direction of reference numeral 20, i.e., that varying the distance between the platens and the molded material including base material 7 or the fine structure is accompanied in addition to movement in the direction denoted by reference numeral 20 when the aforementioned lateens 11 and 12 are arranged on and separated from the molding/processing position respectively. The aforementioned movement is similarly performed also in the remaining embodiments, although not particularly stated.

Base material 7 may be any substance so far as the same has prescribed rigidity and thermal conductivity. For example, a metal plate, a heat-resistant resin plate, a composite layer of resin and ceramics or a combinational layer thereof can be employed. Also as to the form thereof, a cut plate, a batch veneer, a continuous sheet, a continuously supplied type one or a windable and rewindable coiled one may be employed. A base material arranger (not shown) arranging the aforementioned base material between the opposed platens and the molded material may also comprise any device structure so far as the same is an apparatus arranging the base material on the aforementioned position in response to the aforementioned form of the base material.

The basic element in the processing method of a fine structure according to this embodiment resides in the operation of processing the fine structure by introducing the base material into a space between the molded material and the opposed platens. According to this structure, abrupt temperature change applied to the mold and a resulting load impact can be softened.

The aforementioned base material may be rendered higher in rigidity and larger in thermal conductivity than the molded material. According to this method, the aforementioned temperature impact or load impact resulting from the base material can be more reliably softened.

The elastic coefficient of the aforementioned base material can be set to at least 100 GPa. According to the method employing this base material, it is possible to withstand the molding pressure applied to the base material itself and abrupt temperature change (load impact) resulting from small thermal capacity of the small base material thickness. If the elastic coefficient of the base material is less than 100 GPa, it is impossible to withstand the molding pressure and the operation of processing the fine structure is hindered.

The thermal conductivity of the aforementioned base material can be set to at least 20 W/(m·° C.). According to the method employing this base material, a temperature following time after contact with the opposed platens is reduced, and the throughput can be improved. If the thermal conductivity of the base material is less than 20 W/(m·° C.), a heat exchange rate between the opposed platens and the resin is insufficient, and reduction of the temperature following time is restrictive. In the aforementioned second embodiment, description has been made on the premise of the system moving the platens in order to use two platens while a single fine structure is processed. However, an apparatus moving the mold while keeping the two platens stationary or a system of moving both of the platens and the mold may be employed so far as two platens can be used while a single fine structure is processed. Needless to say, the platens can also be moved along with the mold when the mold is moved in this case. At this time, the base material is moved while keeping the state pressing the resin or the film against the mold. The drive unit moving the mold while pressing the resin or the film against the mold with interposition of the base material can be constituted of an arbitrary known apparatus of this type.

Third Embodiment

Figure 3:
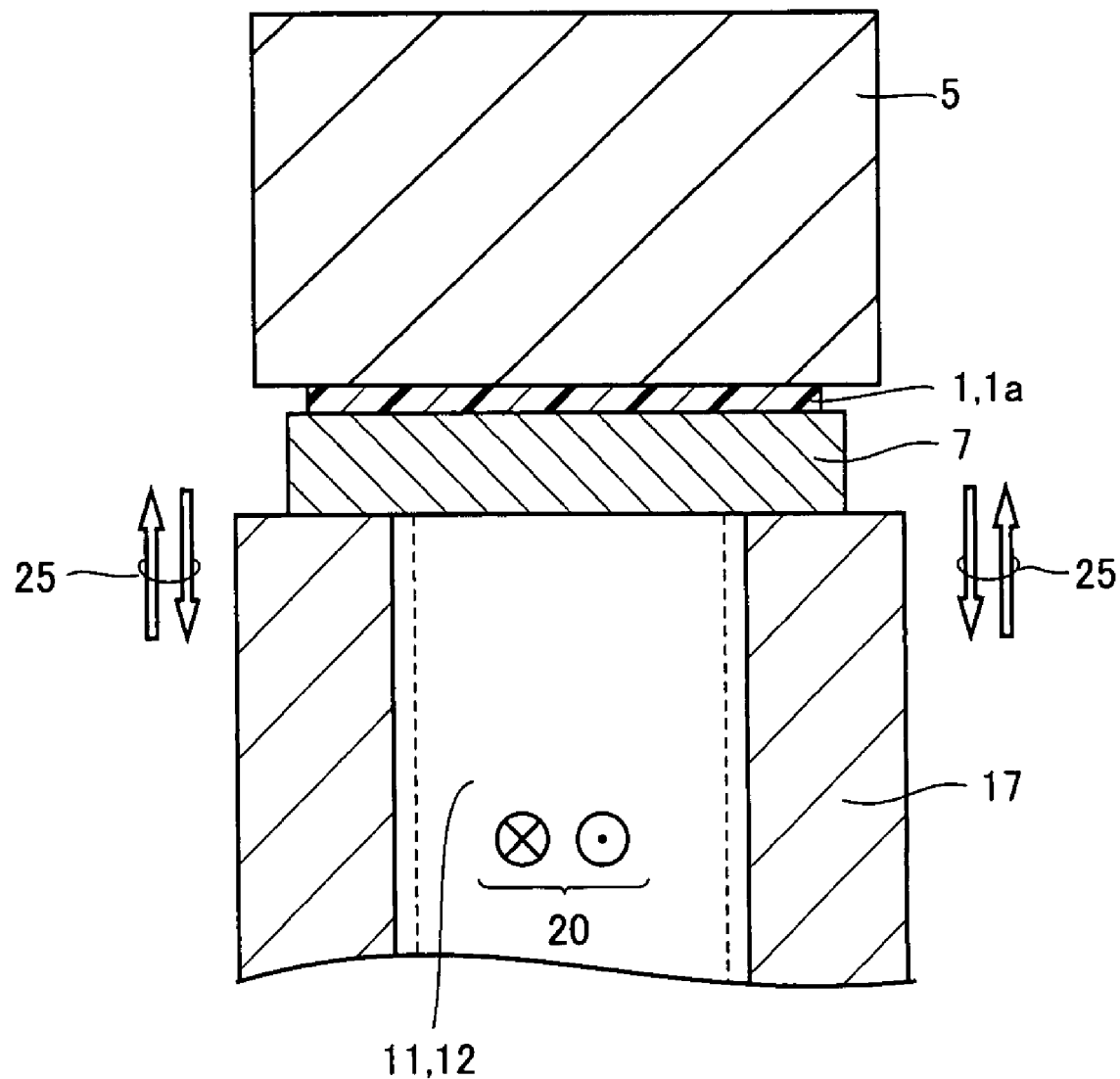
FIG. 3 is a sectional view showing processing equipment of a fine structure according to a third embodiment of the present invention.

FIG. 3 is a partial sectional view of a processing equipment of a fine structure according to a third embodiment of the present invention. Referring to FIG. 3, a base material 7 is supported by a base material support mechanism 17 to maintain a state pressing a film 1 against a mold 5 while a platen 12 is arranged on a molding/processing position when a platen 11 moves to a retreat position after molding/processing. Base material support mechanism 17 is constituted of a post or a thick plate reciprocative in a direction 25. Base material support mechanism 17, coming into contact with base material 7 along with platens 11 and 12, is so provided as not to overlap with platens 11 and 12 arranged on the molding/processing position.

With the aforementioned base material support mechanism 17, relative positions of the mold and a molded material can be maintained, and a precise fine structure can be processed.

The basic element of the processing equipment of fine structure according to the aforementioned embodiment resides in that the same comprises the base material located between opposed platens and the molded material and comprises the base material support mechanism for maintaining a molding load by pressing the molded material against the mold with interposition of the base material. According to this apparatus, relative positions of the mold and the molded material in molding/processing can be maintained, and the shape of a portion such as a corner of the mold easily causing a defect (chipping or the like) can be maintained up to a cooling cycle. Consequently, a more precise fine structure can be obtained. In the aforementioned third embodiment, description has been made on the premise of the system moving the platens in order to use two platens while a single fine structure is processed. However, an apparatus moving the mold while keeping the two platens stationary or a system of moving both of the platens and the mold may be employed so far as two platens can be used while a single fine structure is processed. In this case, the base material is also moved along with the mold when the mold is moved, while the base material support mechanism keeps the state of pressing resin or a film against the mold with interposition of the base material during this movement. The aforementioned drive unit and the base material support mechanism can be constituted of arbitrary known apparatuses of this type.

Examples 1 and 2 carried out by processing fine structures for wiring patterns having prescribed line widths are now described.

Example 1

Fine molding on a PC (polycarbonate) film (molded material) of 200 μm in thickness was executed with a mold (±0.3 μm) of L/S (Line/Space)=50/50 μm. The PC film was preheated to 100° C. with a ceramics heater constituting a part of a preheater. Then, a heating platen 11 heated to 180° C. and the PC film are brought into contact with each other, and the temperature is further increased. After 60 seconds from the contact between platen 11 and the PC film, pressurization/molding was executed by pressing a mold 5.

Thereafter heating platen 11 was removed, and a cooling platen 12 of 60° C. was pressed against a molded/processed fine structure (PC film) 1a for cooling the same. After 60 seconds from contact between cooling platen 12 and PC film 1a, PC film 1a was unmolded from mold 5. The time of one cycle from placement of the aforementioned PC film on a molding position of the mold up to unmolding was 5 minutes.

Example 2

Fine molding on a PC film of 100 μm in thickness was executed with a mold (±0.3 μm) of L/S=50/50 μm. The PC film was preheated to 100° C. with a ceramics heater. In advance of placement of PC film 1 on a molding position of the mold, on the other hand, a platen 11 of 180° C. has already come into contact with an AlN substrate (base material) 7 having high thermal conductivity for heating AlN substrate 7. PC film 1 is placed on this AlN substrate 7 and heated. After 60 seconds from the operation of placing the PC film on AlN substrate 7, pressurization/molding was executed by pressing a mold 5.

Thereafter platen 11 was removed, and a platen 12 of 60° C. was pressed through AlN substrate 7 for performing cooling while pressing AlN substrate 7. After 180 seconds from the operation of pressing platen 12, a PC film 1a which is a molded fine structure was unmolded from mold 5. The time of one cycle from placement of the aforementioned PC film on a molding position of the mold up to unmolding was 7 minutes. While a conventional cycle cannot be sweepingly mentioned since thermal capacity remarkably varies with the specification of an apparatus, 20 minutes to 30 minutes were necessary when heating and cooling steps for the platens were rate-determined.

Fourth Embodiment

A fourth embodiment of the present invention is now described. The fourth embodiment is a modification of the aforementioned second embodiment described with reference to FIG. 2. While platen 11 has been employed for heating base material 7 and platen 12 has been employed for cooling in the second embodiment, both of platens 11 and 12 comprise heating and cooling systems in FIG. 2 so that the respective ones are used in both steps of heating and cooling a base material 7 in the fourth embodiment.

In this embodiment, a PC film 1 is heated with first platen 11 of a high-temperature state through base material 7 for molding a PC film 1 with a mold 5, and thereafter platen 11 is cooled and PC film 1 is unmolded from mold 5 after reaching a prescribed temperature, as shown in FIG. 2. In this period, platen 12 waits in a high-temperature state, in order to heat a subsequent PC film 1. At a point of time for entering a molding step for subsequent PC film 1 after completing unmolding of a single PC film 1, platen 11 is exchanged with platen 12 of the high-temperature state, so that heating, molding, cooling and unmolding steps similar to the above are repeated.

Example 3

Fine molding on a PC (polycarbonate) film (molded material) of 200 μm in thickness was executed with a mold (±0.3 μm) of L/S (Line/Space)=50/50 μm. The PC film was preheated to 100° C. with a ceramics heater constituting a part of a preheater. Then, a platen 11 heated to 180° C. and PC film 1 are brought into contact with each other, and the temperature is further increased. After 60 seconds from the contact between platen 11 and PC film 1, pressurization/molding was executed by pressing a mold 5.

Thereafter platen 11 was cooled, and PC film 1 was unmolded from mold 5 after reaching 60° C. Thereafter a cooling platen 12 was further pressed against a molded/processed PC film 1a for cooling the same. After 60 seconds from the contact between cooling platen 12 and PC film 1a, PC film 1a was unmolded from mold 5. The time of one cycle from placement of the aforementioned PC film on a molding position of the mold up to unmolding was 6 minutes. In this process, platen 12 is heated to 180° C., and platens 11 and 12 are exchanged in exchange of PC film 1.

Table 1 shows results obtained by measuring line widths in the fine structures (wiring patterns) processed in the aforementioned Examples 1 to 3 with a laser microscope along with the aforementioned cycles. According to Table 1, all of Examples 1 to 3 have been finished to target line widths on the average, and variation ranges are also within an allowable range (±1.0 μm).

TABLE 1

| | Example 1 | Example 2 | Example 3 | Measuring Means |
|---|---|---|---|---|
| Line Width (μm) | 50.0 ± 0.5 | 50.0 ± 0.3 | 50.0 ± 0.3 | Laser Microscope |
| Cycle (min.) | 5 | 7 | 6 | — |

Fifth Embodiment

Figure 4:
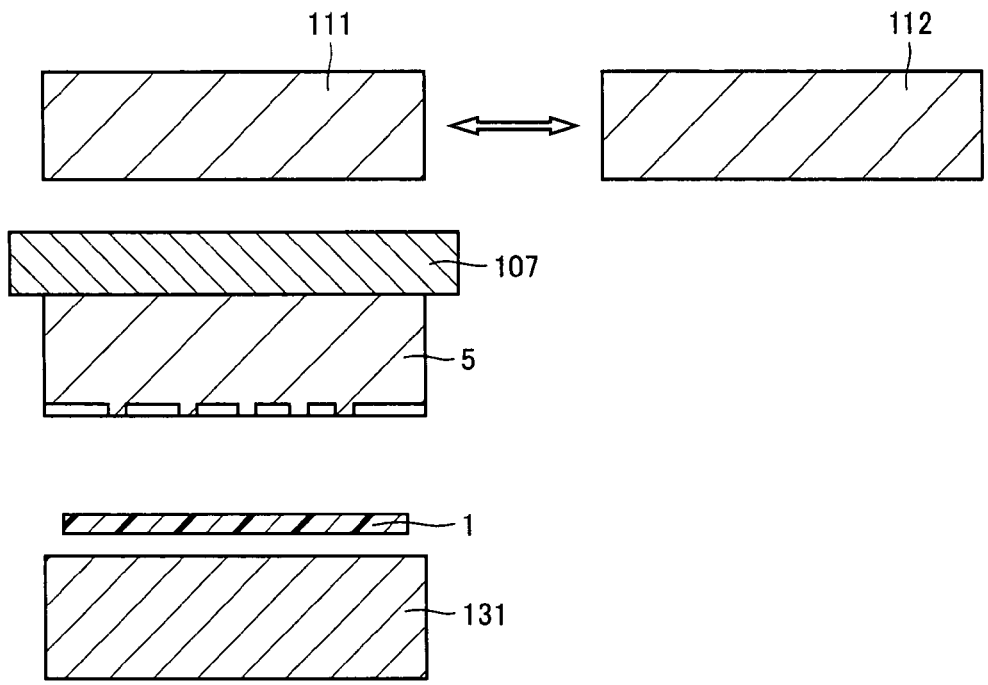
FIG. 4 is a sectional view showing processing equipment of a fine structure according to a fifth embodiment of the present invention.

A fifth embodiment of the present invention is now described with reference to FIG. 4. According to the fifth embodiment, a PC film 1 serving as a molded material is molded by bringing a base material 107 into contact with a mold 5 and heating or cooling mold 107 with platens 111 and 112 through this base material 107. A member 131 serving both as a temperature setter and an opposed platen is arranged on a position opposed to a molding surface of mold 5 for holding a PC film 1 along with mold 5. Platens 111 and 112 may be employed for only heating and only cooling respectively similarly to the second embodiment, or the respective ones of platens 111 and 112 may be employed for both of heating and cooling similarly to the fourth embodiment.

Example 4

The following molding of a fine structure was executed with the technique of the aforementioned fifth embodiment.

Fine molding on a PC film 1 of 100 μm in thickness was executed with a mold (±0.3 μm) of L/S=50/50 μm. PC film 1 was preheated to 100° C. with a ceramics heater. In advance of placement of PC film 1 on a molding position of the mold, on the other hand, a platen 111 of 180° C. has already come into contact with an AlN substrate (base material) 107 having high thermal conductivity for heating AlN substrate 107. The back surface of mold 5 is brought into contact with a surface of this AlN substrate 107 opposed to PC film 1 for heating the same. After 60 seconds from an operation of placing a mold 5 on AlN substrate 107, pressurization/molding was executed by pressing PC film 1 against mold 5.

Thereafter platen 111 was removed, and a platen 112 of 60° C. was pressed through AlN substrate 107 for performing cooling while pressing AlN substrate 107. After 120 seconds from the operation of pressing platen 112, a PC film 1a which is a molded fine structure was unmolded from mold 5. The time of one cycle from placement of the aforementioned PC film on a molding position of the mold up to unmolding was 6 minutes.

Sixth Embodiment

Figure 5:
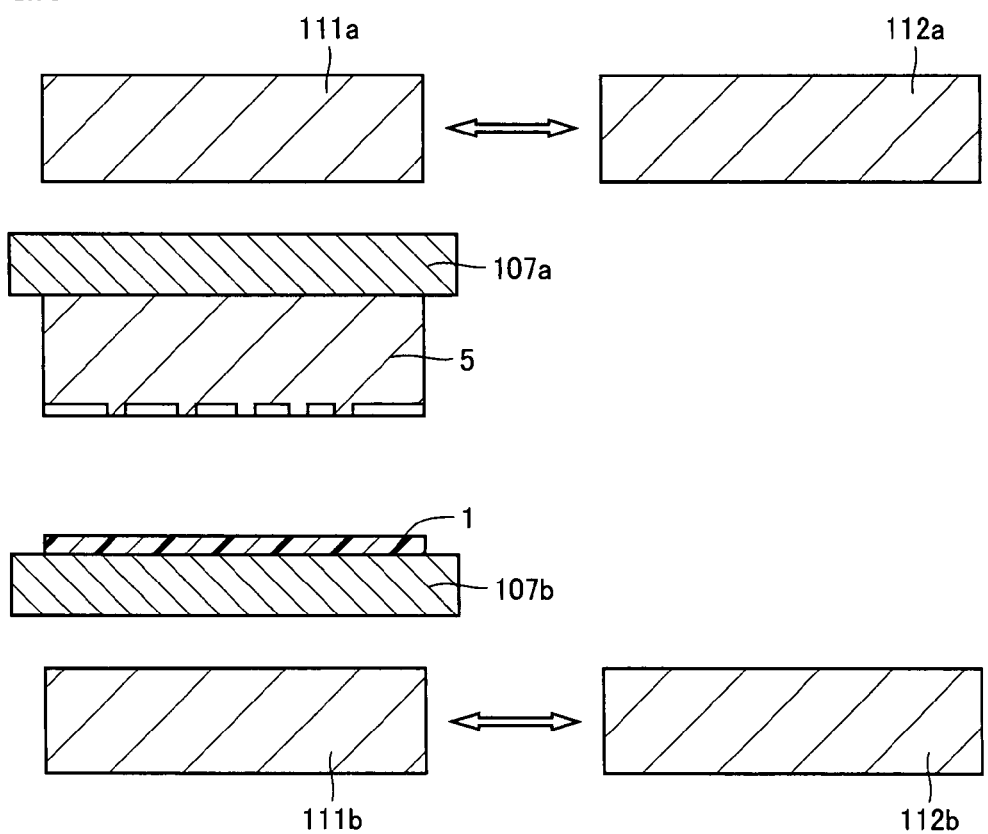
FIG. 5 is a sectional view showing processing equipment of a fine structure according to a sixth embodiment of the present invention.

A sixth embodiment of the present invention is now described with reference to FIG. 5. According to the sixth embodiment, a PC film 1 employed as a molded material is molded by bringing a base material 107a into contact with a mold 5 and heating or cooling mold 5 with platens 111a and 112a through this base material 107a, similarly to the aforementioned fifth embodiment. This embodiment is different from the fifth embodiment in a point of bringing another base material 107b into contact with a surface of PC film 1 opposite to the side opposed to mold 5 and heating and/or cooling PC film 1 with platens 111b and 112b through this base material 107b.

Example 5

The following molding of a fine structure was executed with the technique of the aforementioned sixth embodiment. As shown in FIG. 5, a mold 5 is heated with a platen 111a of 180° C. through a base material 107a while pressing base material 107a constituted of an AlN substrate against the back surface of mold 5. In parallel with this, a PC film 1 is heated with a platen 111b of 180° C. through a base material 107b while pressing base material 107b constituted of an AlN substrate against the back surface of PC film 1. Thereafter platens 111a and 111b were removed in the state pressing base materials 107a and 107b against mold 5 and PC film 1, and platens 111a and 111b of 60° C. were pressed against base materials 107a and 107b for 90 seconds, for cooling mold 5 and PC film 1 through base materials 107a and 107b respectively. According to this Example, the time of one cycle from placement of PC film 1 on a molding position of the mold up to unmolding was 5.5 minutes.

Table 2 shows results obtained by measuring line widths in the fine structures (wiring patterns) processed in the aforementioned Examples 4 and 5 with a laser microscope along with the aforementioned cycles. According to Table 2, both of Examples 4 and 5 have also been finished to target line widths on the average, and variation ranges are also within the allowable range (±1.0 μm).

TABLE 2

|  | Example 4 | Example 5 | Measuring Means |
| --- | --- | --- | --- |
| Line Width (μm) | 50.0 ± 0.3 | 50.0 ± 0.3 | Laser Microscope |
| Cycle (min.) | 6 | 5.5 | — |

Seventh Embodiment

Figure 6:
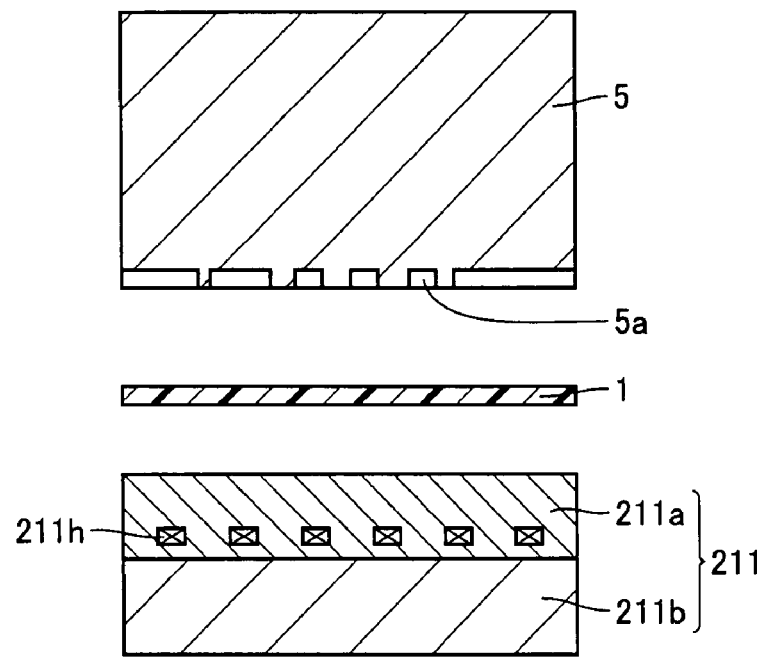
FIG. 6 is a sectional view showing an outline of processing equipment of a fine structure according to a seventh embodiment of the present invention.
Figure 7:
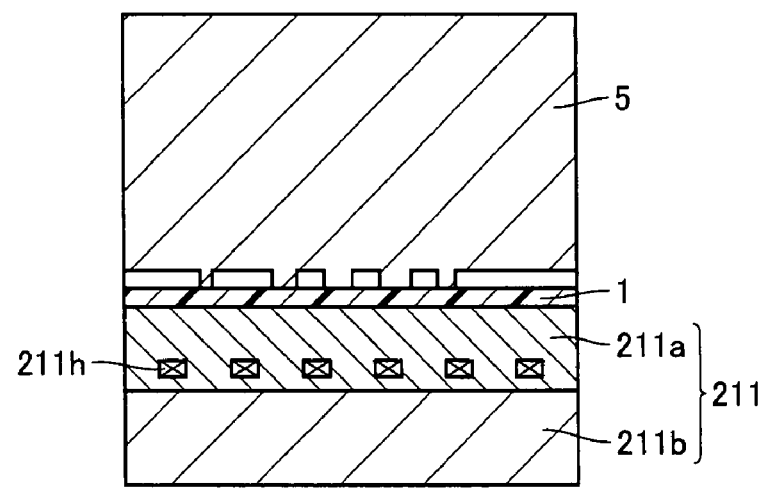
FIG. 7 is a first step sectional view showing the outline of the processing method of a fine structure according to the seventh embodiment of the present invention.
Figure 7:
Figure 8:
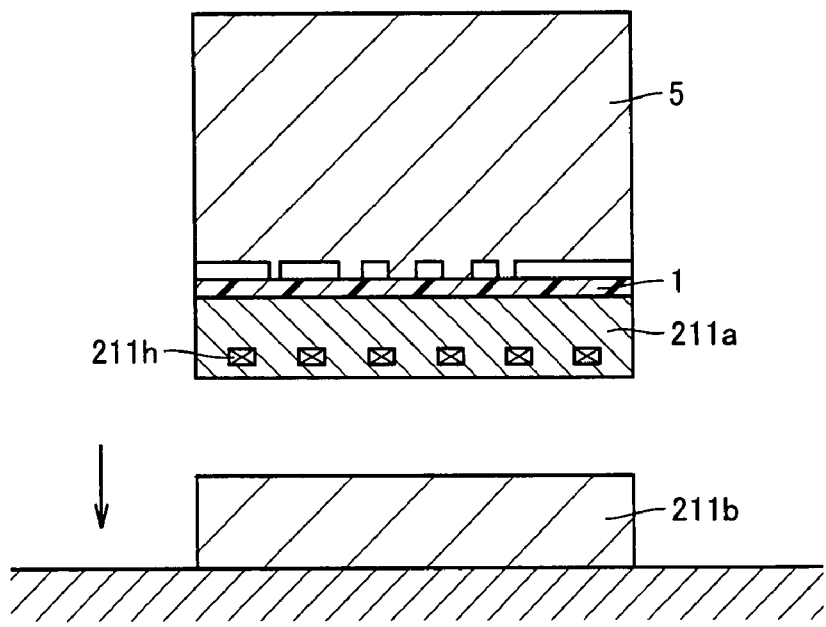
FIG. 8 is a second step sectional view showing the outline of the processing method of a fine structure according to the seventh embodiment of the present invention.

As to a seventh embodiment of the present invention, a processing equipment and a processing method of a fine structure according to this embodiment are now described with reference to FIGS. 6 to 8. FIG. 6 is a longitudinal sectional view showing the schematic structure of the processing equipment of a fine structure according to this embodiment, and FIGS. 7 and 8 are first and second step sectional views showing the processing method of a fine structure according to this embodiment.

The processing equipment of a fine structure according to this embodiment comprises a mold 5, and an opposed platen 211 provided to be movable in position and space between a molding/processing position and a retreat position is arranged under this mold 5. A mold section 5a formed with a prescribed pattern is provided on a side of mold 5 closer to opposed platen 211. A film 1 which is a molded material is arranged between mold section 5a and opposed platen 211.

Mold 5 and opposed platen 211 are provided to be relatively movable between the molding/processing position and the retreat position with a drive unit (illustration omitted). This drive unit can be implemented with an arbitrary mechanism normally used for this type of drive unit.

Opposed platen 211 has a first block 211a, located on the front surface, including heating apparatuses 211h and a second block 211b located on the back surface. First block 211a and second block 211b are provided to be relatively movable between positions where first block 211a and second block 211b come into contact with each other and other positions where first block 211a and second block 211b separate from each other with a platen drive unit (illustration omitted). While this platen drive unit can be implemented with an arbitrary mechanism normally used for this type of drive unit, a vacuum absorber is preferably employed for vacuum-absorbing first block 211a and second block 211b in a view of reducing thermal resistance on the contact portion between the blocks and improving heat transfer efficiency.

In order to reduce the thermal resistance on the contact portion between the blocks and improving the heat transfer efficiency, further, the surface roughness (Ra) of the contact surface of either block is preferably not more than 0.5 μm.

While well-known heating apparatuses can be embedded, heating apparatuses 211h included in first block 211a are preferably ceramics heaters prepared by forming heating elements on ceramics members for generating heat by energization in view of the soaking property of opposed platen 211. A material selected from a group consisting of aluminum oxide, aluminum nitride, silicon nitride, silicon carbide and boron nitride is preferably employed as the ceramics.

A material selected from a group consisting of aluminum, magnesium, copper, iron, stainless, aluminum oxide, aluminum nitride, silicon nitride, silicon carbide and boron nitride having high thermal conductivity is preferably employed for first block 211a and second block 211b, in order to efficiently implement heat transfer. In order to further improve the heat transfer efficiency, the thermal capacity of second block 211b is preferably at least 30% of the total thermal capacity of first block 211a and second block 211b.

In the processing equipment of a fine structure having the aforementioned structure, opposed platen 211 is first heated to a molding temperature with heating apparatuses 211h, and opposed platen 211 is thereafter moved from the retreat position to the molding/processing position for pressing film 1 against mold 5 and pressurizing/heating/molding/processing the same, as shown in FIG. 7. Thereafter a load in the aforementioned molding/processing is maintained for a constant time. In cooling, second block 211b is separated from first block 211a, as shown in FIG. 8.

Thus, second block 211b is so separated from first block 211a in cooling as to reduce the total thermal capacity of opposed platen 211 by reducing the volume of opposed platen 211 in cooling and to physically discharge heat stored in opposed platen 211, thereby improving the cooling rate for opposed platen 211. Thus, cooling efficiency for opposed platen 211 is improved, so that the heat cycle of opposed platen 211 can be reduced.

Film 1 may be preheated with a preheater (illustration omitted) before the same is placed on the molding/processing position. The preheater may be a furnace held at a constant temperature, or a heating apparatus such as a heater.

Eight Embodiment

Figure 9:
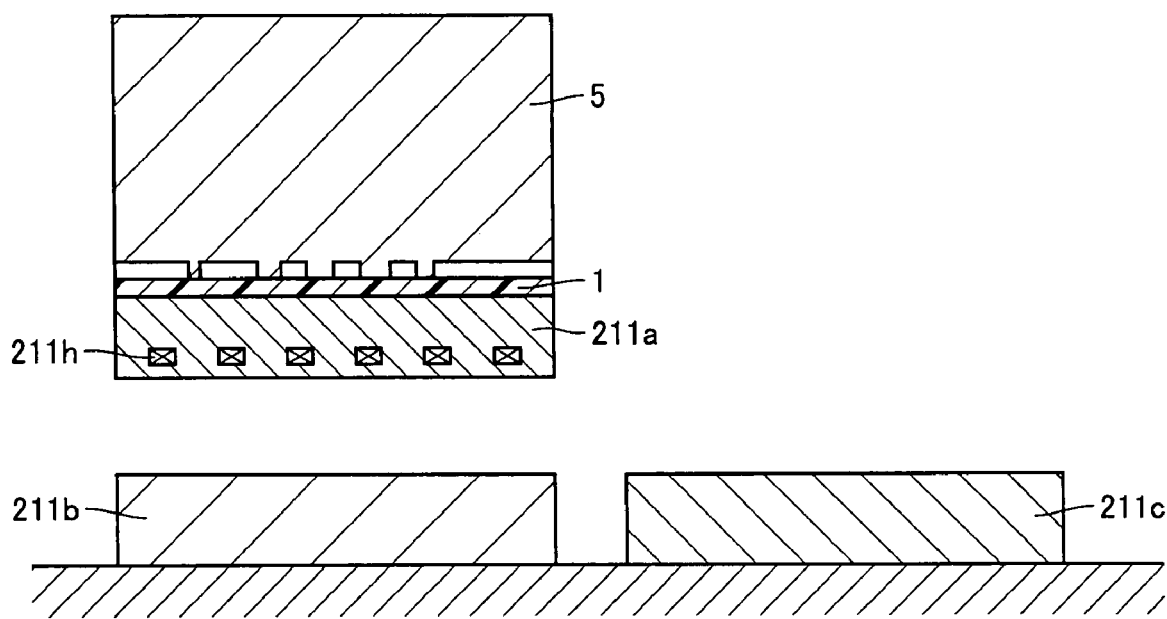
FIG. 9 is a first step sectional view showing an outline of a processing method of a fine structure according to an eighth embodiment of the present invention.
Figure 10:
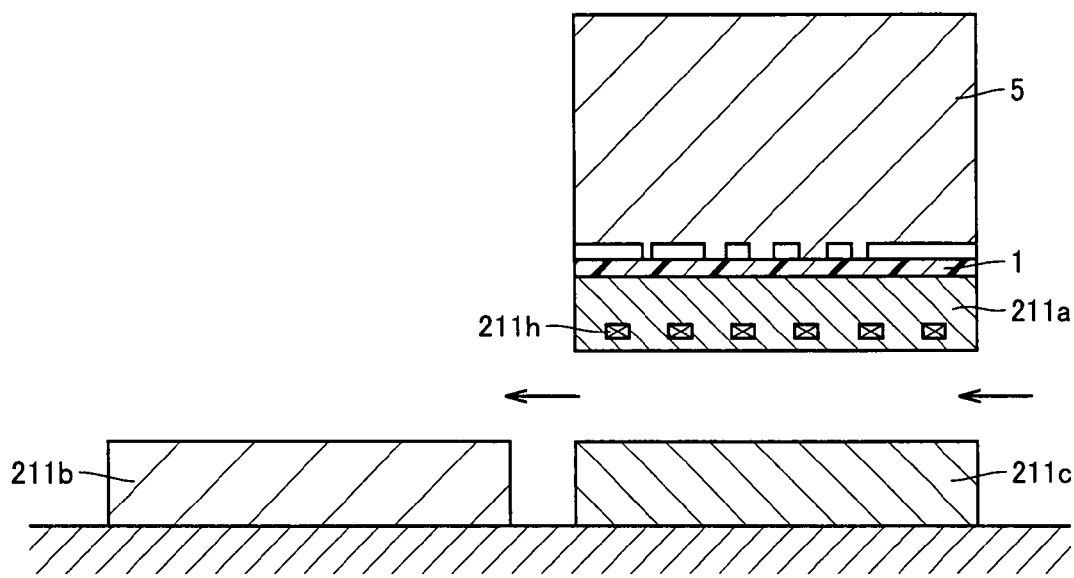
FIG. 10 is a second step sectional view showing the outline of the processing method of a fine structure according to the eighth embodiment of the present invention.
Figure 11:
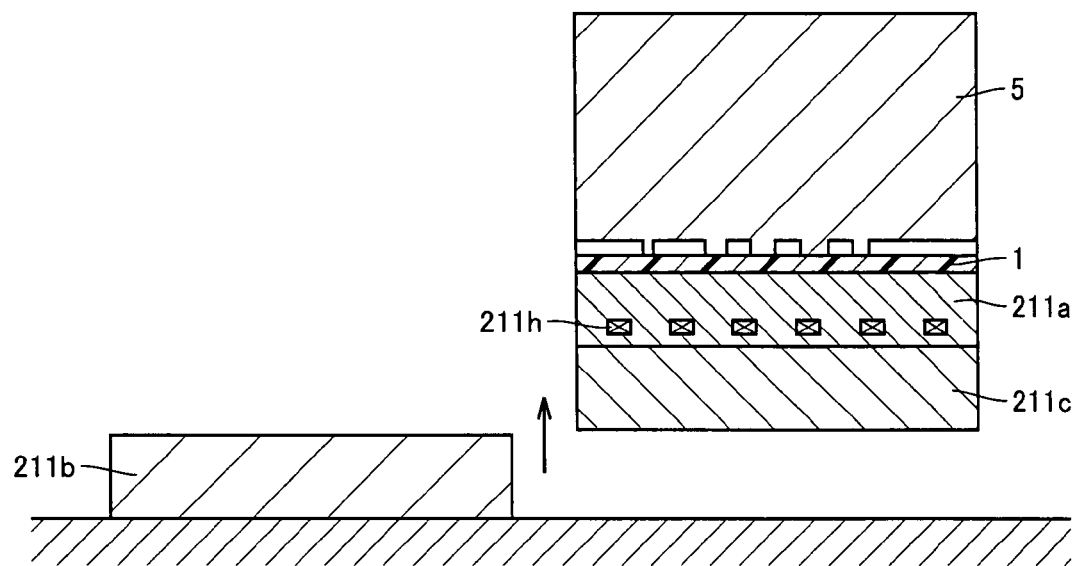
FIG. 11 is a third step sectional view showing the outline of the processing method of a fine structure according to the eighth embodiment of the present invention.

A processing equipment and a processing method of a fine structure according to this embodiment are now described with reference to FIGS. 9 to 11. FIGS. 9 to 11 are first to third step sectional views showing the processing method of a fine structure according to this embodiment. Parts identical or corresponding to those of the processing equipment of a fine structure in the aforementioned embodiment are denoted by the same reference numerals, and redundant description is not repeated.

In the aforementioned embodiment, second block 211b has been separated from first block 211a in cooling, thereby attaining improvement of the cooling efficiency for opposed platen 211. According to this embodiment, improvement of cooling efficiency for an opposed platen 211 is further attained, while attaining heating efficiency in heating in a subsequent step. As shown in FIG. 9, the processing equipment of a fine structure according to this embodiment has a third block 211c constituted of a structure substantially similar to that of a second block 211b.

Second block 211b is heated in a heating step, and hence second block 211b and third block 211c are moved in a cooling step as shown in FIG. 10, for bringing third block 211c into contact with a first block 211a as shown in FIG. 11.

Thus, the total thermal capacity of opposed platen 211 is reduced by reducing the volume of opposed platen 211 immediately after heating for physically discharging heat stored in opposed platen 211, while third block 211c which is an external member is brought into contact with first block 211a in cooling so that heat provided in first block 211a moves to third block 211c which is in a cooled state in cooling, thereby attaining improvement of the cooling rate for the opposed platen.

Second block 211b is in a state already heated to some extent, whereby improvement of the heating efficiency for opposed platen 11 can also be attained by bringing second block 211b into contact with first block 211a in place of third block 211c in heating in the subsequent step.

Ninth Embodiment

Figure 12:
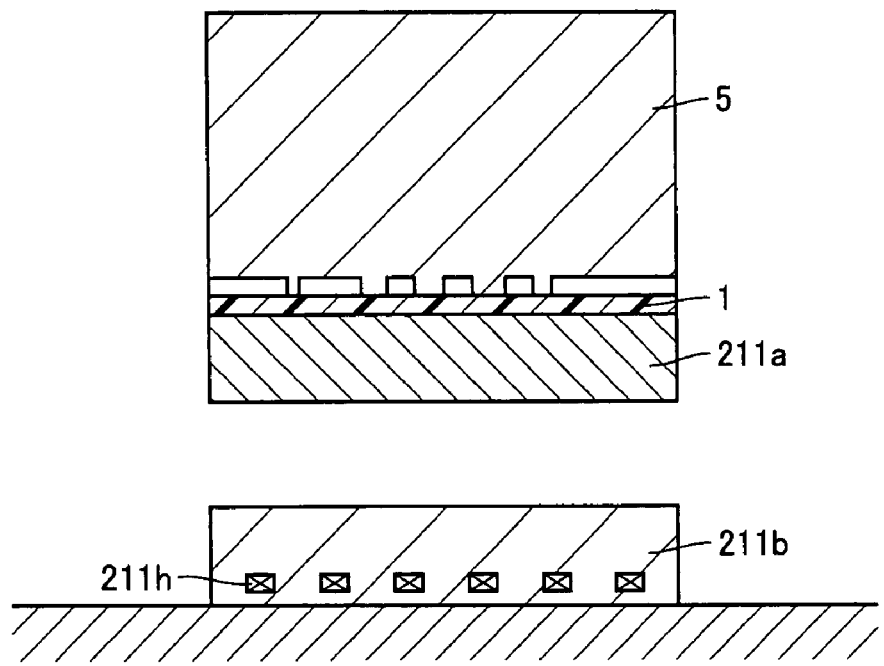
FIG. 12 is a first step sectional view showing an outline of a processing method of a fine structure according to a ninth embodiment of the present invention.
Figure 13:
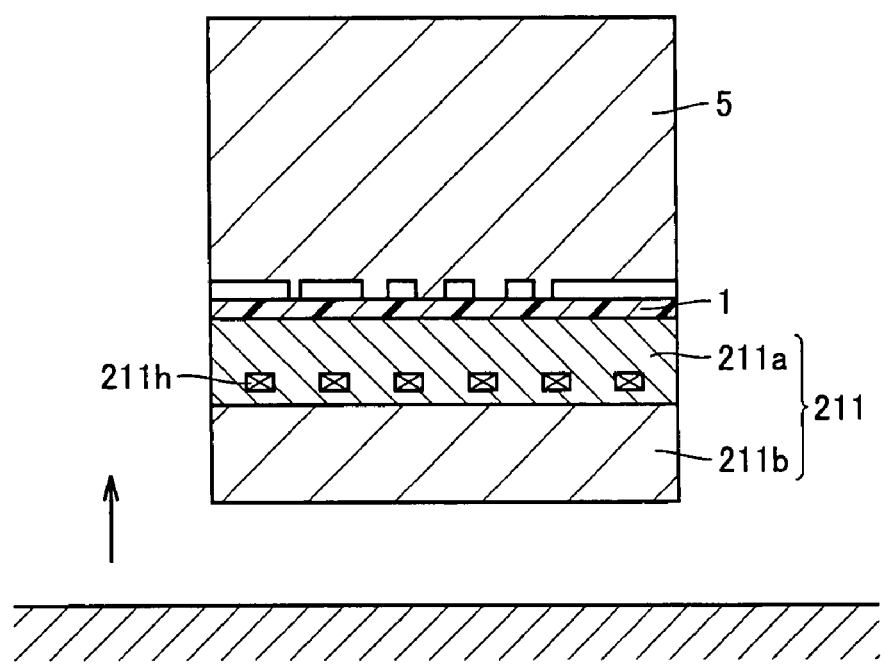
FIG. 13 is a second step sectional view showing the outline of the processing method of a fine structure according to the ninth embodiment of the present invention.

A processing equipment and a processing method of a fine structure according to this embodiment are now described with reference to FIGS. 12 and 13. FIGS. 12 and 13 are first and second step sectional views showing the processing method of a fine structure according to this embodiment. Parts identical or corresponding to those of the processing equipment of a fine structure in each of the aforementioned embodiments are denoted by the same reference numerals, and redundant description is not repeated.

In the aforementioned embodiment, second block 211b has been separated from first block 211a in cooling, thereby attaining improvement of the cooling efficiency for opposed platen 211. According to this embodiment, only a first block 211a is employed in a heating step, and a second block 211b is first brought into contact with first block 211a in a cooling step. First, an opposed platen 211 is moved from a retreat position to a molding/processing position for pressing a film 1 against a mold 5 in a state separating second block 211b from first block 211a, as shown in FIG. 12. Thereafter a load in the aforementioned molding/processing is maintained for a constant time.

In cooling, second block 211b which is in a cooled state is brought into contact with first block 211a, as shown in FIG. 13. Thus, the volume of opposed platen 211 in cooling is increased and heat provided in first block 211a moves toward second block 211b, so that improvement of the cooling rate for opposed platen 211 can be attained.

Figure 14:
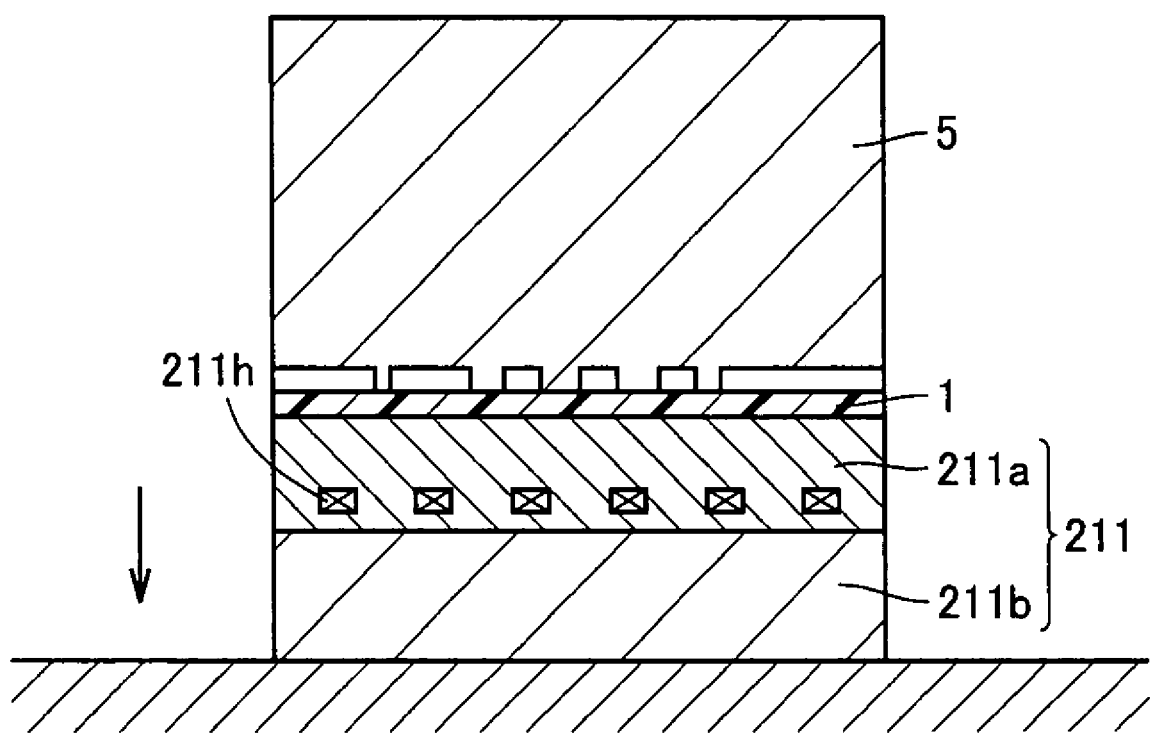
FIG. 14 is a step sectional view showing another outline of the processing method of a fine structure according to the ninth embodiment of the present invention.

While the case of bringing second block 211b into contact with first block 211a by moving second block 211b has been described with reference to FIG. 13, it is also possible to fix second block 211b for integrally moving mold 5, film 1 and first block 211a toward second block 211b as shown in FIG. 14.

Second block 211b and third block 211c, basically performing reciprocation which is linear movement with respect to first block 211a in each of the aforementioned embodiments, are not restricted to this movement mode but any movement mode may be employed so far as second block 211b and third block 211c circularly move, such that a plurality of second blocks 211b and a plurality of third blocks 211c may circularly revolve, or may move while changing the vertical positions, for example.

Examples 6 and 7 carried out by processing fine structures for wiring patterns having prescribed line widths are now described.

Example 6

Fine molding on a PC (polycarbonate) film (molded material) of 100 μm in thickness was executed with a mold (±0.3 μm) of L/S (Line/Space)=50/50 μm. The PC film was preheated to 100° C. with a ceramics heater constituting a part of a preheater. Then, a heating first block 211a heated to 170° C. and the PC film were brought into contact with each other, and the temperature was further increased. After 60 seconds from the contact between first block 211a and the PC film, a mold 5 was pressed for executing pressurization/heating/molding.

Thereafter a second block 211b was separated from first block 211a, and PC film 1 was unmolded from mold 5 after the temperature of first block 211a reached 60° C. The time of one cycle from placement of the aforementioned PC film 1 on a molding position of the mold up to unmolding was 8 minutes.

Example 7

Fine molding on a PC (polycarbonate) film (molded material) of 100 μm in thickness was executed with a mold (±0.3 μm) of L/S (Line/Space)=50/50 μm. The PC film was preheated to 100° C. with a ceramics heater constituting a part of a preheater. Then, a heating first block 211a heated to 170° C. and the PC film were brought into contact with each other, and the temperature was further increased. After 60 seconds from the contact between first block 211a and the PC film, a mold 5 was pressed for executing pressurization/heating/molding.

Thereafter a second block 211b was separated from first block 211a, and a cooling third block 211c was brought into contact with first block 211a. After the temperature of first block 211a reached 60° C., PC film 1 was unmolded from mold 5. The time of one cycle from placement of the aforementioned PC film 1 on a molding position of the mold up to unmolding was 5 minutes.

Tenth Embodiment

Figure 15:
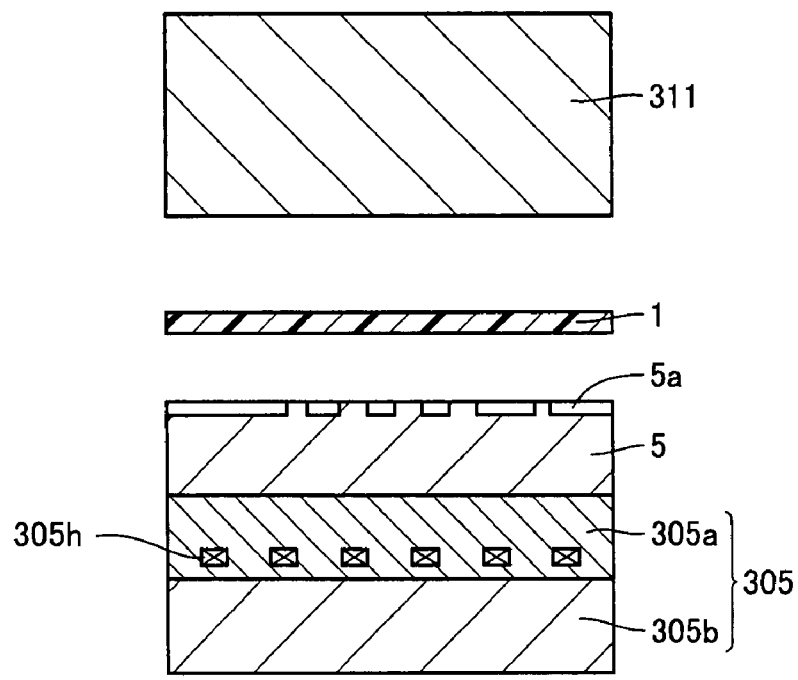
FIG. 15 is a longitudinal sectional view showing a schematic structure of a processing equipment of a fine structure according to a tenth embodiment of the present invention.
Figure 16:
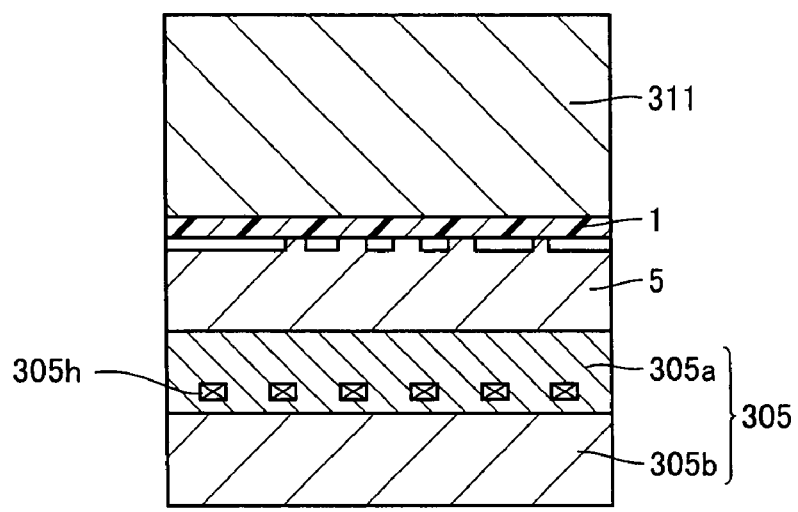
FIG. 16 is a first step sectional view of a processing method of a fine structure according to the tenth embodiment of the present invention.
Figure 16:
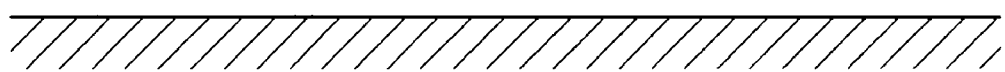
Figure 17:
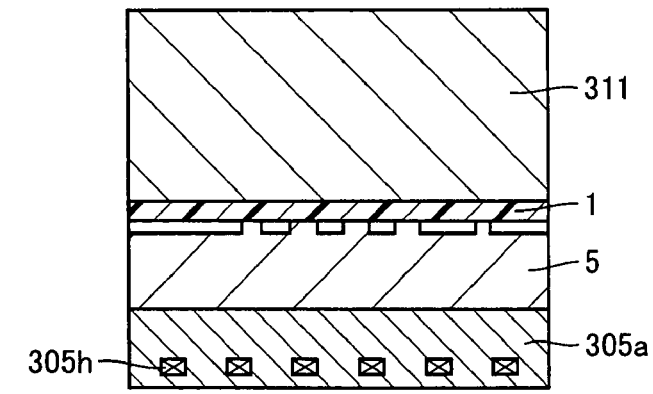
FIG. 17 is a second step sectional view of the processing method of a fine structure according to the tenth embodiment of the present invention.
Figure 17:
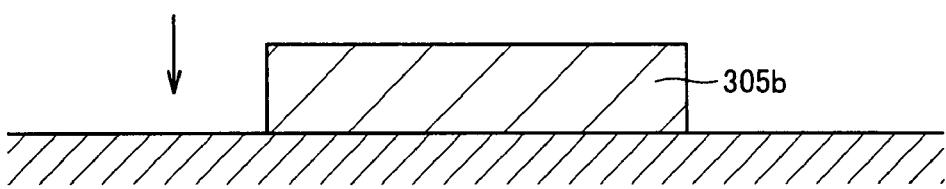

As to a tenth embodiment of the present invention, a processing equipment and a processing method of a fine structure according to this embodiment are now described with reference to FIGS. 15 to 17. FIG. 15 is a longitudinal sectional view showing a schematic structure of the processing equipment of a fine structure according to this embodiment, and FIGS. 16 and 17 are first and second step sectional views showing the processing method of a fine structure according to this embodiment.

First, the processing equipment of a fine structure according to this embodiment comprises a mold 5, and an opposed platen 311 provided to be movable in position and space between a molding/processing position and a retreat position is arranged above this mold 5. A mold section 5a formed with a prescribed pattern is provided on a side of mold 5 closer to opposed platen 311. A film 1 which is a molded material is arranged between mold section 5a and opposed platen 311.

Mold 5 and opposed platen 311 are provided to be relatively movable between the molding/processing position and the retreat position with a drive unit (illustration omitted). This drive unit can be implemented with an arbitrary mechanism normally used for this type of drive unit.

Mold 5 has a first block 305a, located on an upper side, including heating apparatuses 305h and a second block 305b located on a lower side on a surface (lower surface in the figure) opposite to the side opposed to PC film 1. First block 305a and second block 305b are provided to be relatively movable between positions where first block 305a and second block 305b come into contact with each other and other positions where first block 305a and second block 305b separate from each other with a platen drive unit (illustration omitted). While this platen drive unit can be implemented with an arbitrary mechanism normally used for this type of drive unit, a vacuum absorber is preferably employed for vacuum-absorbing first block 305a and second block 305b in a view of reducing thermal resistance on the contact portion between the blocks and improving heat transfer efficiency.

In order to reduce the thermal resistance on the contact portion between the blocks and improving the heat transfer efficiency, further, the surface roughness (Ra) of the contact surface of either block is preferably not more than 0.5 μm.

While well-known heating apparatuses can be embedded, heating apparatuses 305h included in first block 305a are preferably ceramics heaters prepared by forming heating elements on ceramics members for generating heat by energization in view of the soaking property. A material selected from a group consisting of aluminum oxide, aluminum nitride, silicon nitride, silicon carbide and boron nitride is preferably employed as the ceramics.

A material selected from a group consisting of aluminum, magnesium, copper, iron, stainless, aluminum oxide, aluminum nitride, silicon nitride, silicon carbide and boron nitride having high thermal conductivity is preferably employed for first block 305a and second block 305b, in order to efficiently implement heat transfer. In order to further improve the heat transfer efficiency, the thermal capacity of second block 305b is preferably at least 30% of the total thermal capacity of first block 305a and second block 305b.

In the apparatus for processing a fine structure having the aforementioned structure, a heating/cooling block 305 formed by first block 305a and second block 305b is first heated to a molding temperature with heating apparatuses 305h, and mold 5 and opposed platen 311 are thereafter moved from the retreat position to the molding/processing position as shown in FIG. 16, for pressing film 1 against mold 5 and pressurizing/heating/molding/processing the same. Thereafter a load in the aforementioned molding/processing is maintained for a constant time. In cooling, second block 305b is separated from first block 305a, as shown in FIG. 17.

Thus, second block 305b is so separated from first block 305a in cooling as to reduce the total thermal capacity by reducing the volume of block 305 in cooling and to physically discharge heat stored in block 305 thereby improving the cooling rate for block 305. Thus, cooling efficiency for block 305 is improved, so that the heat cycle of block 305 can be reduced.

Film 1 may be preheated with a preheater (illustration omitted) before the same is placed on the molding/processing position. The preheater may be a furnace held at a constant temperature, or a heating apparatus such as a heater.

Eleventh Embodiment

Figure 18:
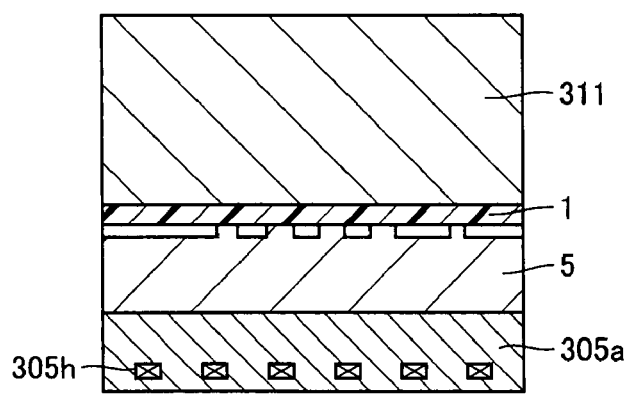
FIG. 18 is a first step sectional view showing an outline of a processing method of a fine structure according to an eleventh embodiment of the present invention.
Figure 18:
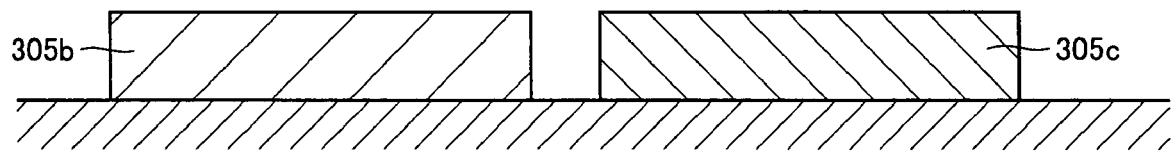
Figure 19:
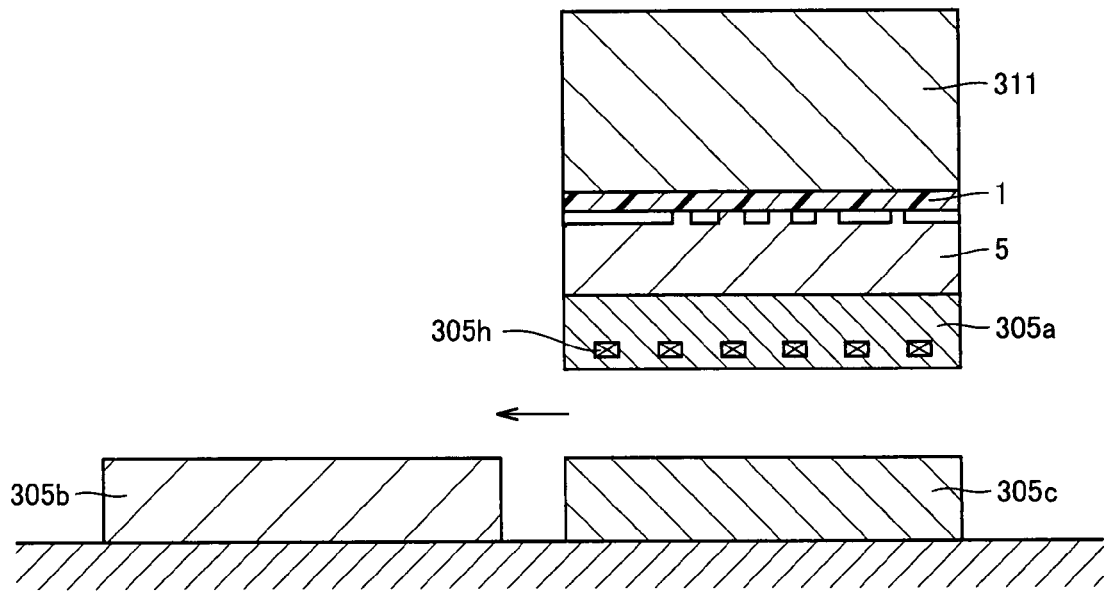
FIG. 19 is a second step sectional view showing the outline of the processing method of a fine structure according to the eleventh embodiment of the present invention.
Figure 20:
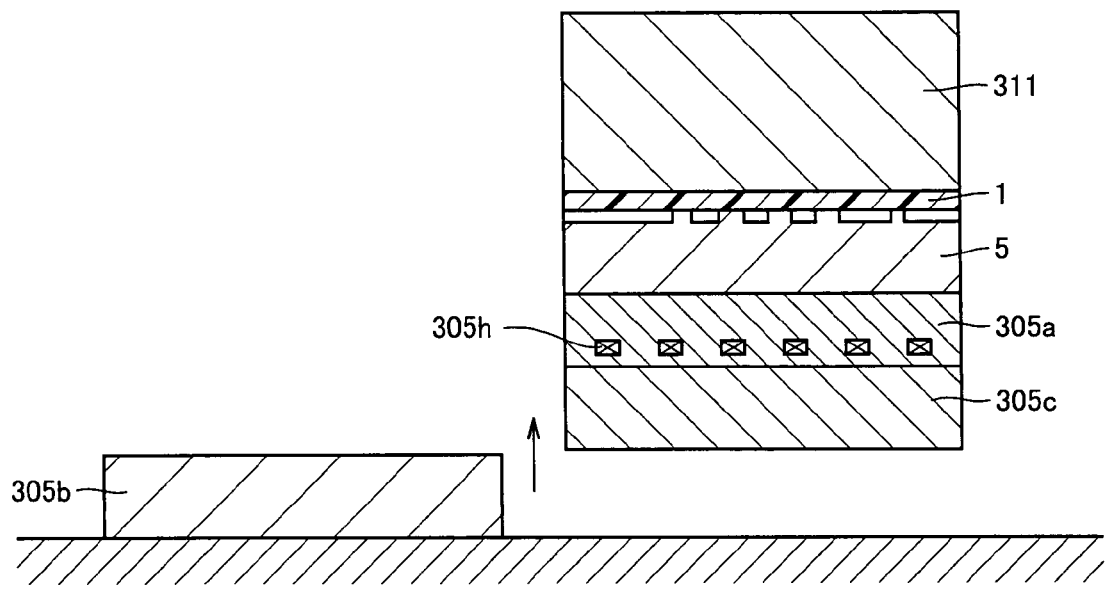
FIG. 20 is a third step sectional view showing the outline of the processing method of a fine structure according to the eleventh embodiment of the present invention.

A processing equipment and a processing method of a fine structure according to an eleventh embodiment are now described with reference to FIGS. 18 to 20. FIGS. 18 to 20 are first to third step sectional views showing the processing method of a fine structure according to this embodiment. Parts identical or corresponding to those of the processing equipment of a fine structure in the aforementioned embodiment are denoted by the same reference numerals, and redundant description is not repeated.

In the aforementioned tenth embodiment, second block 305b has been separated from first block 305a in cooling, thereby attaining improvement of the cooling efficiency for block 305. According to this embodiment, improvement of cooling efficiency for a block 305 is further attained, while attaining improvement of heating efficiency in heating in a subsequent step. As shown in FIG. 18, the processing equipment of a fine structure according to this embodiment has a third block 305c constituted of a structure substantially similar to that of a second block 305b.

Second block 305b is heated in a heating step, and hence second block 305b and third block 305c are moved in a cooling step as shown in FIG. 19, for bringing third block 305c into contact with a first block 305a as shown in FIG. 20.

Thus, the total thermal capacity of a block 305 is reduced by reducing the volume of block 305 immediately after heating for physically discharging heat stored in block 305, while third block 305c which is an external member is brought into contact with first block 305a in cooling so that heat provided in first block 305a moves to third block 305c which is in a cooled state in cooling, thereby attaining improvement of the cooling rate for the opposed platen.

Second block 305b is in a state already heated to some extent, whereby improvement of the heating efficiency for block 305 can also be attained by bringing second block 305b into contact with first block 305a in place of third block 305c in heating in the subsequent step.

Twelfth Embodiment

Figure 21:
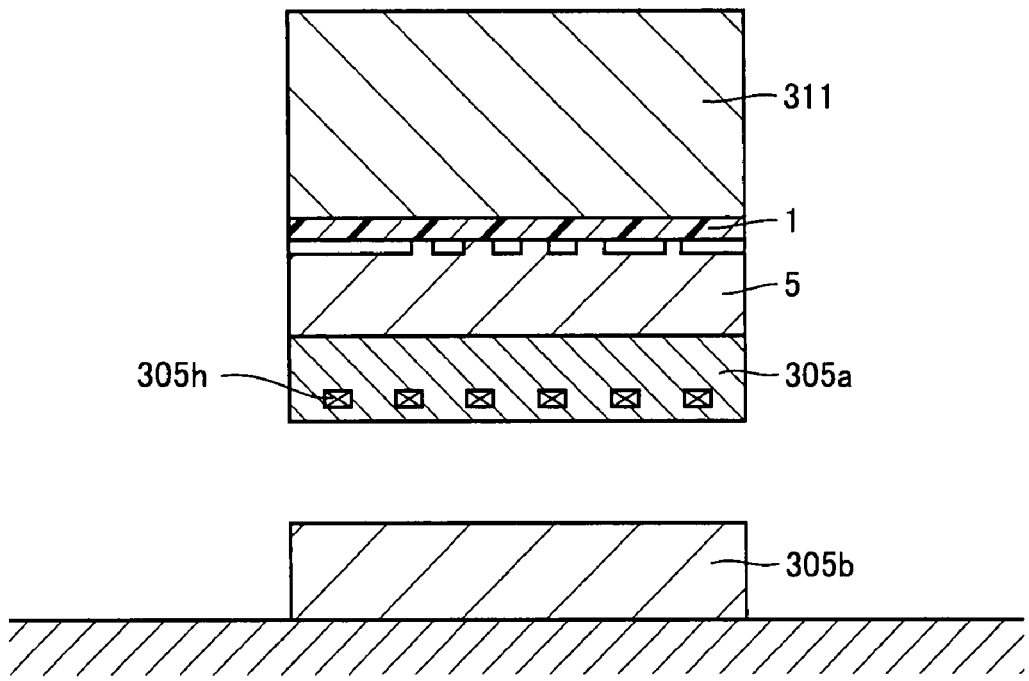
FIG. 21 is a first step sectional view showing an outline of a processing method of a fine structure according to a twelfth embodiment of the present invention.
Figure 22:
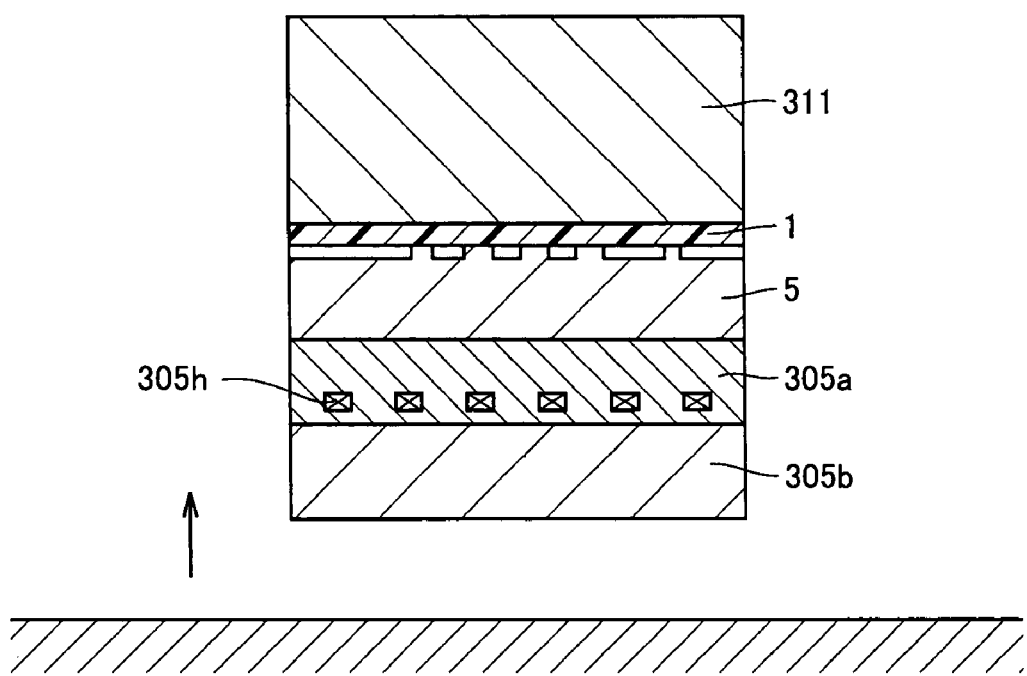
FIG. 22 is a second step sectional view showing the outline of the processing method of a fine structure according to the twelfth embodiment of the present invention.

A processing equipment and a processing method of a fine structure according to a twelfth embodiment are now described with reference to FIGS. 21 and 22. FIGS. 21 and 22 are first and second step sectional views showing the processing method of a fine structure according to this embodiment. Parts identical or corresponding to those of the processing equipment of a fine structure in each of the aforementioned embodiments are denoted by the same reference numerals, and redundant description is not repeated.

In each of the aforementioned tenth and eleventh embodiments, second block 305b has been separated from first block 305a in cooling, thereby attaining improvement of the cooling efficiency for block 305. According to this embodiment, only a first block 305a is employed in a heating step, and a second block 305b is first brought into contact with first block 305a in a cooling step. First, a block 305 is moved from a retreat position to a molding/processing position for pressing a film 1 against a mold 5 in a state separating second block 305b from first block 305a, as shown in FIG. 21. Thereafter a load in the aforementioned molding/processing is maintained for a constant time.

In cooling, second block 305b which is in a cooled state is brought into contact with first block 305a, as shown in FIG. 22. Thus, the volume of block 305 in cooling is increased and heat provided in first block 305a moves toward second block 305b, so that improvement of the cooling rate for block 305 can be attained.

Figure 23:
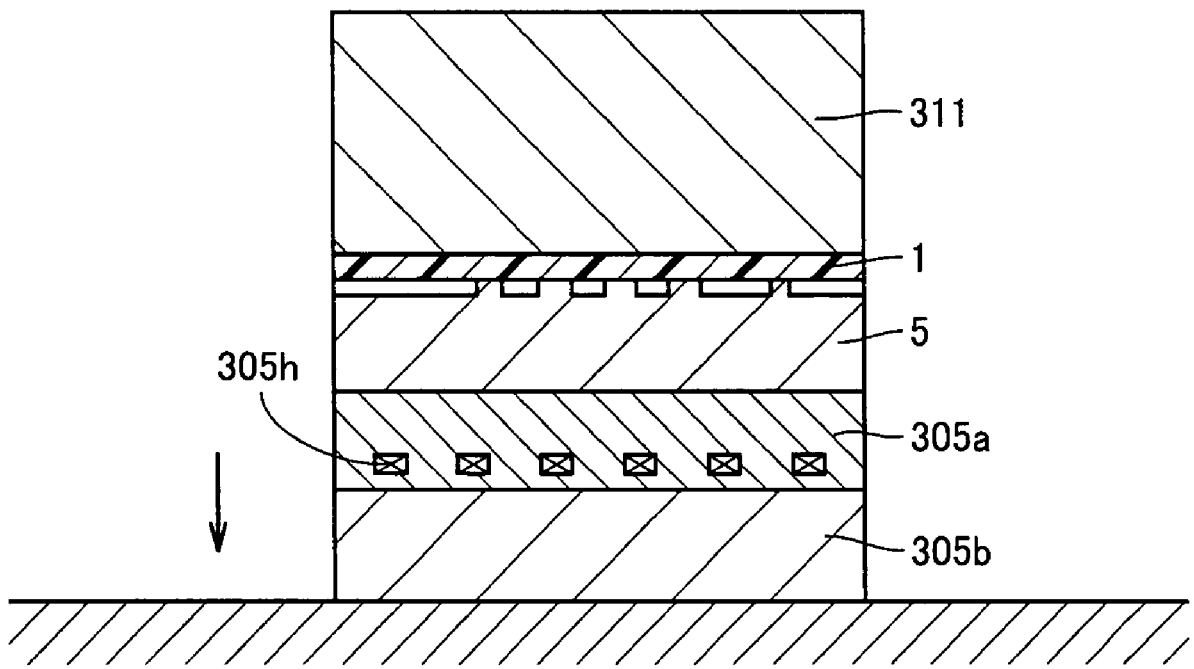
FIG. 23 is a step sectional view showing another outline of the processing method of a fine structure according to the twelfth embodiment of the present invention.

While the case of bringing second block 305b into contact with first block 305a by moving second block 305b has been described with reference to FIG. 22, it is also possible to fix second block 305b for integrally moving mold 5, film 1 and first block 305a toward second block 305b as shown in FIG. 23.

Second block 305b and third block 305c, basically performing reciprocation which is linear movement with respect to first block 305a in each of the aforementioned embodiments, are not restricted to this movement mode but any movement mode may be employed so far as second block 305b and third block 305c circularly move, such that a plurality of second blocks 305b and a plurality of third blocks 305c may circularly revolve, or may move while changing the vertical positions, for example.

Example 8 carried out by processing a fine structure for a wiring pattern having a prescribed line width is now described.

Example 8

Fine molding on a PC film (molded material) 1 of 100 μm in thickness was executed with a mold (±0.3 μm) of L/S (Line/Space)=50/50 μm. PC film 1 was preheated to 100° C. with a ceramics heater constituting a part of a preheater. Then, a heating first block 305a heated to 170° C. and PC film 1 were brought into contact with each other as shown in FIG. 15, and the temperature was further increased. After 60 seconds from the contact between first block 305a and a mold 5, an opposite platen 311 was pressed for executing pressurization/heating/molding, as shown in FIG. 16.

Thereafter a second block 305b was separated from first block 305a as shown in FIG. 17, and a cooling third block 305c was brought into contact with first block 305a as shown in FIGS. 18 to 20. After the temperature of first block 305a reached 60° C., PC film 1 was unmolded from mold 5. The time of one cycle from placement of the aforementioned PC film 1 on a molding position of the mold up to unmolding was 7 minutes.

Table 3 shows results obtained by measuring line widths in the fine structures (wiring patterns) processed in the aforementioned Examples 6 to 8 with a laser microscope along with the aforementioned cycles. According to Table 3, both of Examples 4 and 5 have also been finished to target line widths on the average, and variation ranges are also within the allowable range (±1.0 μm).

TABLE 3

|  | Example 6 | Example 7 | Example 8 | Measuring Means |
|---|---|---|---|---|
| Line Width (μm) | 50.0 ± 0.3 | 50.0 ± 0.3 | 50.0 ± 0.3 | Laser Microscope |
| Cycle (min.) | 8 | 5 | 7 | — |

The embodiments and Examples disclosed this time are to be considered as illustrative and not restrictive in all points. The scope of the present invention is shown not by the above description but by the scope of claim for patent, and it is intended that all modifications within the meaning and range equivalent to the scope of claim for patent are included.

INDUSTRIAL APPLICABILITY

According to the present invention, it is possible to process a high-quality fine structure with high efficiency and a high yield with the original method and apparatus thereof, and it is expected that the present invention makes a remarkable contribution in this field in the near future.

The invention claimed is:

1. A processing equipment of a fine structure, for processing a fine structure by holding a molded material between a mold and an opposed platen and pressurizing/heating/molding said molded material,
    said opposed platen includes:
    a first block, including a heating apparatus, positioned on a side opposed to said molded material, and
    a second block positioned on a side opposite to the side opposed to said molded material,
    a third block,
    wherein said first block and said second block are provided to be relatively movable between positions where said first block and said second block come into contact with each other and other positions where said first block and said second block separate from each other,
    said second block is brought into contact with said first block when heating said first block with said heating apparatus,
    said second block is controlled to separate from said first block when cooling said first block, and
    said third block is brought into contact with said first block for cooling said first block.

2. The processing equipment of a fine structure according to claim 1, wherein
    the thermal capacity of said second block is at least 30% of the total thermal capacity of said first block and said second block.

3. The processing equipment of a fine structure according to claim 1, separating said second block from said first block when heating said first block with said heating apparatus, and
    controlling said second block to come into contact with said first block when cooling said first block.

4. The processing equipment of a fine structure according to claim 1, having a vacuum absorber for bringing said each block into contact with said first block by vacuum absorption for bringing said each block into contact with said first block.

5. The processing equipment of a fine structure according to claim 1, wherein
the surface roughness (Ra) of a contact surface of either block is not more than 0.5 μm,
in contact between said first block and said each block.

6. The processing equipment of a fine structure according to claim 1, wherein
said heating apparatus is a heater prepared by forming a heating element on a ceramics member for generating heat by energization.

7. The processing equipment of a fine structure according to claim 6, wherein
said ceramics is a material selected from a group consisting of aluminum oxide, aluminum nitride, silicon nitride, silicon carbide and boron nitride.

8. The processing equipment of a fine structure according to claim 1, wherein
said each block is a material selected from a group consisting of aluminum, magnesium, copper, iron, stainless, aluminum oxide, aluminum nitride, silicon nitride, silicon carbide and boron nitride.

9. The processing equipment of a fine structure according to claim 1, further comprising a preheater for preheating said molded material before heated/molded.

10. A processing equipment of a fine structure, for processing a fine structure by holding a molded material between a mold and an opposed platen and pressurizing/heating/molding said molded material,
comprising a heating/cooling block heating and cooling said molded material from the back surface of said molded material, wherein
said heating/cooling block includes:
a first block, including a heating apparatus, positioned on a side opposed to said molded material, and
a second block positioned on a side opposite to the side opposed to said molded material,
a third block,
wherein said first block and said second block are provided to be relatively movable between positions where said first block and said second block come into contact with each other and other positions where said first block and said second block separate from each other,
said second block is brought into contact with said first block when heating said first block with said heating apparatus,
said second block is controlled to separate from said first block when cooling said first block, and
said third block is brought into contact with said first block for cooling said first block.

11. The processing equipment of a fine structure according to claim 10, wherein
the thermal capacity of said second block is at least 30% of the total thermal capacity of said first block and said second block.

12. The processing equipment of a fine structure according to claim 10, separating said second block from said first block when heating said first block with said heating apparatus, and controlling said second block to come into contact with said first block when cooling said first block.

13. The processing equipment of a fine structure according to claim 10, having a vacuum absorber for bringing said each block into contact with said first block by vacuum absorption for bringing said each block into contact with said first block.

14. The processing equipment of a fine structure according to claim 10, wherein
the surface roughness (Ra) of a contact surface of either block is not more than 0.5 μm,
in contact between said first block and said each block.

15. The processing equipment of a fine structure according to claim 10, wherein
said heating apparatus is a heater prepared by forming a heating element on a ceramics member for generating heat by energization.

16. The processing equipment of a fine structure according to claim 15, wherein
said ceramics is a material selected from a group consisting of aluminum oxide, aluminum nitride, silicon nitride, silicon carbide and boron nitride.

17. The processing equipment of a fine structure according to claim 10, wherein
said each block is a material selected from a group consisting of aluminum, magnesium, copper, iron, stainless, aluminum oxide, aluminum nitride, silicon nitride, silicon carbide and boron nitride.

18. The processing equipment of a fine structure according to claim 10, further comprising a preheater for preheating said molded material before heated/molded.

* * * * *